(12) United States Patent
Wu

(10) Patent No.: US 6,575,231 B1
(45) Date of Patent: Jun. 10, 2003

(54) SPIRAL STEP-SHAPED HEAT DISSIPATING MODULE

(76) Inventor: Chun-Chih Wu, 6F, No., 55, Sec. 2, Wan Mei St, Wen Shan District, Taipei (TW)

( * ) Notice: Subject to any disclaimer, the term of this patent is extended or adjusted under 35 U.S.C. 154(b) by 0 days.

(21) Appl. No.: 10/228,302

(22) Filed: Aug. 27, 2002

(51) Int. Cl.[7] .................................................. F24H 3/02
(52) U.S. Cl. ...................... 165/121; 165/80.3; 361/697; 361/703; 257/722
(58) Field of Search ................................ 165/80.3, 185, 165/121, 122; 257/722; 361/697, 703, 704, 710

(56) References Cited

U.S. PATENT DOCUMENTS

| | | | |
|---|---|---|---|
| 5,365,400 A | * 11/1994 | Ashiwake et al. | 165/80.3 |
| 5,502,619 A | * 3/1996 | Wang | 361/697 |
| 5,567,986 A | * 10/1996 | Ishida | 257/722 |
| 5,583,746 A | * 12/1996 | Wang | 361/697 |
| 5,654,587 A | * 8/1997 | Schneider et al. | 257/722 |
| 6,125,920 A | * 10/2000 | Herbert | 165/80.3 |
| 6,193,205 B1 | * 2/2001 | Wang | 361/710 |
| 6,199,625 B1 | * 3/2001 | Guerrero | 165/80.3 |
| 6,202,738 B1 | * 3/2001 | Tanaka et al. | 165/80.3 |
| 6,450,250 B2 | * 9/2002 | Guerrero | 165/80.3 |
| 2002/0023737 A1 | * 2/2002 | Hao | 165/121 |
| 2002/0060902 A1 | * 5/2002 | Lee | 361/704 |

* cited by examiner

Primary Examiner—Henry Bennett
Assistant Examiner—Terrell McKinnon
(74) Attorney, Agent, or Firm—Browdy and Neimark, P.L.L.C.

(57) ABSTRACT

A heat dissipating module of the invention, used to dissipate the heat irradiated from a heat-emitting element, comprises a heat sink. The heat sink comprises a plurality of heat dissipating plates, formed by stamping, that are axially stacked over one another while being angularly rotated relative to one another to form a spiral and stepped shape, each heat dissipating plate being further provided with a plurality of convection holes. The heat dissipating module further includes a fan and a guiding plate to achieve optimal heat dissipation performance. Since the heat sink is principally formed by stamping with an increased surface area, the manufacture cost is reduced while the heat dissipation effects are improved.

12 Claims, 7 Drawing Sheets

SPIRAL STEP-SHAPED HEAT DISSIPATING MODULE

BACKGROUND OF THE INVENTION

1. Field of the Invention

The invention relates to a spiral step-shaped heat dissipating module. More particularly, the invention provides a heat dissipating module that comprises a heat sink that is principally formed by stamping and has a spiral and stepped shape so as to increase the heat dissipating surface area, reduce the fabrication cost, and achieves an optimal heat dissipation performance.

2. Description of the Related Art

As illustrated in FIG. 1, to dissipate the heat irradiated from a heat-emitting element such as a central processing unit (CPU), a heat sink 2A is conventionally mounted on the CPU 1A. The heat sink 2A is usually formed via aluminum-extrusion and includes a plurality of fins 21A. Via the heat sink 2A, the heat irradiated from the CPU 1A can be dissipated. To further improve the heat dissipating effects, a heat dissipating fan may be further added to produce an airflow that promotes the thermal convection from the heat sink 2A.

The person skilled in the art knows that aluminum extrusion for forming the traditional heat sink 2A is not easily processed and does not allow complicated shapes. The heat dissipating surface area of the conventional heat sink is therefore usually limited, which is detrimental to its performance. To increase the surface area of the heat sink 2A, the manufacture cost by aluminum extrusion is negatively increased.

SUMMARY OF THE INVENTION

It is therefore a principal object of the invention to provide a spiral step-shaped heat dissipating module that comprises a heat sink principally formed by stamping so as to reduce its manufacture cost.

It is another object of the invention to provide a spiral step-shaped heat dissipating module comprises a heat sink that is principally formed by stamping and is spiral step-shaped to increase its surface area, which improve its heat dissipation performance.

To accomplish the above and other objectives, a heat dissipating module of the invention, used to dissipate the heat irradiated from a heat-emitting element, comprises a fan, for example an axial flow fan, at a central portion of which is mounted a heat sink. The heat sink comprises a plurality of heat dissipating plates, formed by stamping, that are axially stacked over one another while being angularly rotated relative to one another to form a spiral and stepped shape, each heat dissipating plate being further provided with a plurality of convection holes. Between the fan and the heat-emitting element is mounted a guiding plate that is provided with a plurality of guiding grooves that extend radially. Via the convection holes and the guiding grooves, the airflow produced by the rotation of the fan generates an optimal thermal convection achieved through the heat sink. Furthermore, via the guiding grooves, the heat is further guided to be dissipated through the spiral periphery of the heat sink.

In accordance with the above objectives, the stack of the heat dissipating plates is achieved by means of a protractor head to angularly rotate the heat dissipating plates relative to one another in order to form a spiral step-shaped. The heat dissipating plates are fixedly fastened with one another via solder pastes, rivets, or nails.

To provide a further understanding of the invention, the following detailed description illustrates embodiments, and examples of the invention, this detailed description being provided only for illustration of the invention.

BRIEF DESCRIPTION OF THE DRAWINGS

The drawings included herein provide a further understanding of the invention. A brief introduction of the drawings is as follows.

DETAILED DESCRIPTION OF THE PREFERRED EMBODIMENTS

Figure 1:
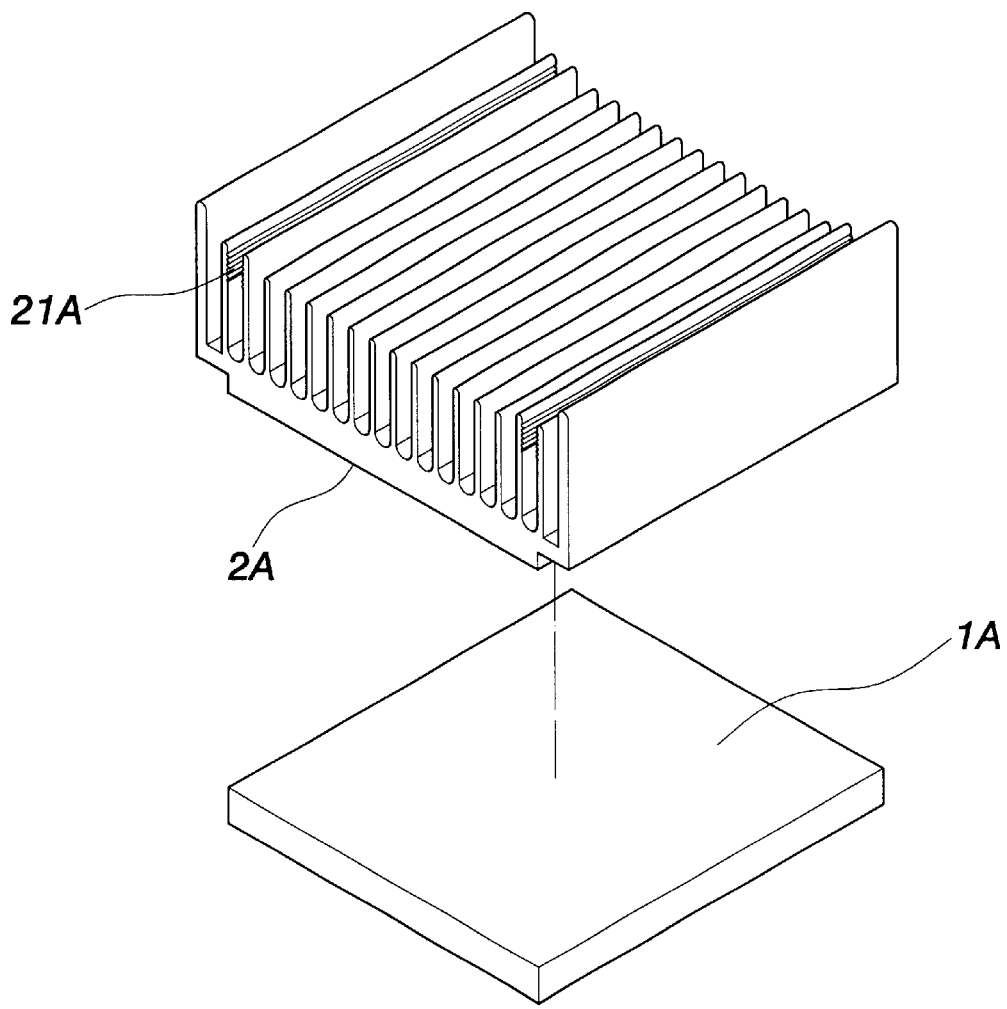
FIG. 1 is a perspective view of a conventional heat sink.

Wherever possible in the following description, like reference numerals will refer to like elements and parts unless otherwise illustrated.

Figure 2:
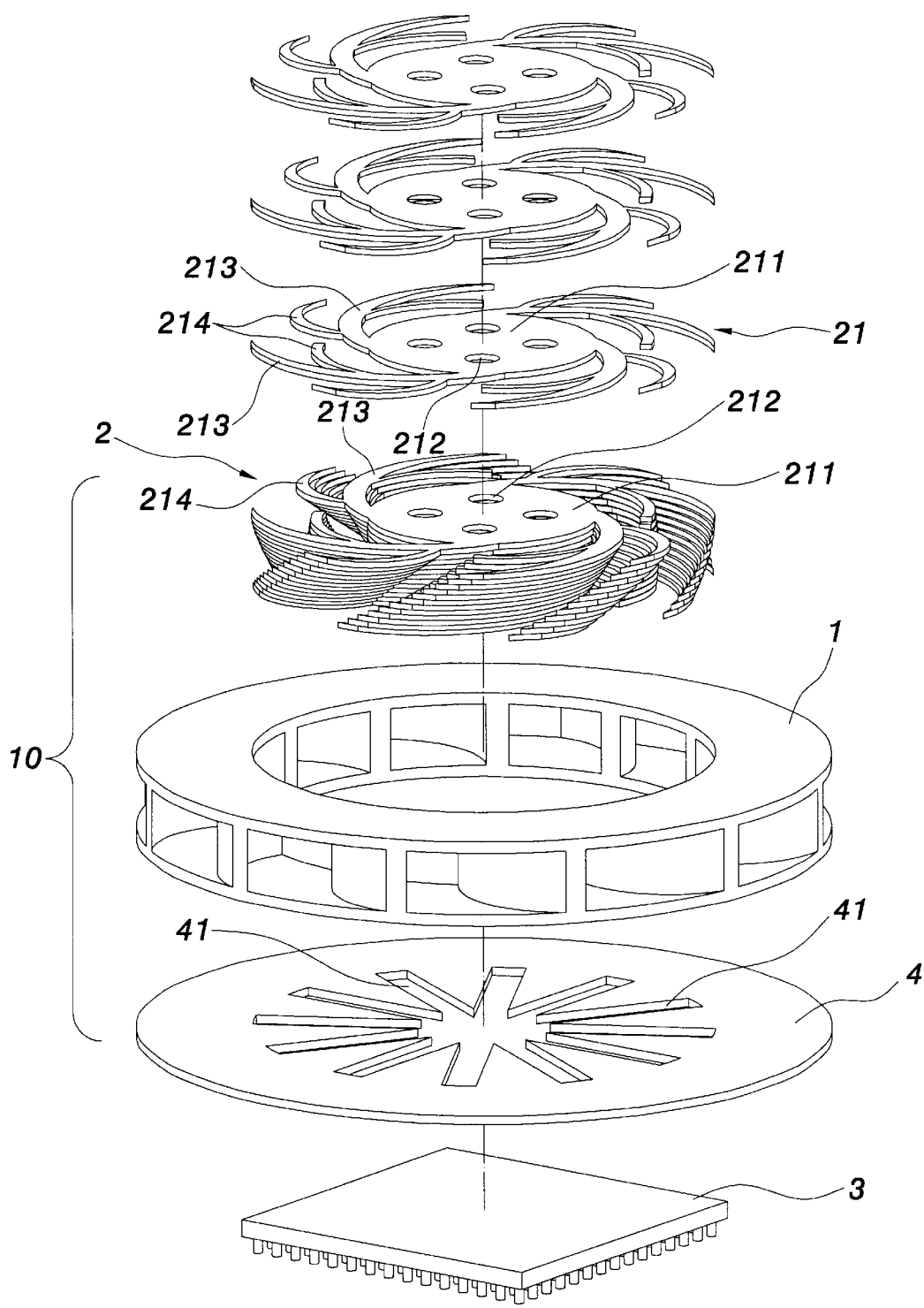
FIG. 2 is an exploded view of a heat dissipating module according to an embodiment of the invention.

Referring to FIG. 2, an exploded view schematically illustrates a spiral step-shaped heat dissipating module 10 according to an embodiment of the invention. The heat dissipating module 10 is used to dissipate the heat irradiated from a heat irradiating device such as a CPU 3. The heat dissipating module 10 comprises a heat dissipating fan 1, that is an axial-flow type fan provided with a central hollow portion for mounting a heat sink 2.

The heat ink 2 comprises a plurality of heat dissipating plates 21, formed by stamping, which are stacked over one another. Each of the heat dissipating plates 21 has a base 211 through which are formed a plurality of convection holes 212. In this embodiment, the number of convection holes 212 is, for example, four. At an outer periphery, the base 211 extends into a plurality of branches 213 in spiral shape. Each branch 213 further extends into a plurality of sub-branches 214 in a tree-branch extension manner to increase the surface area of the heat sink 2.

Figure 3:
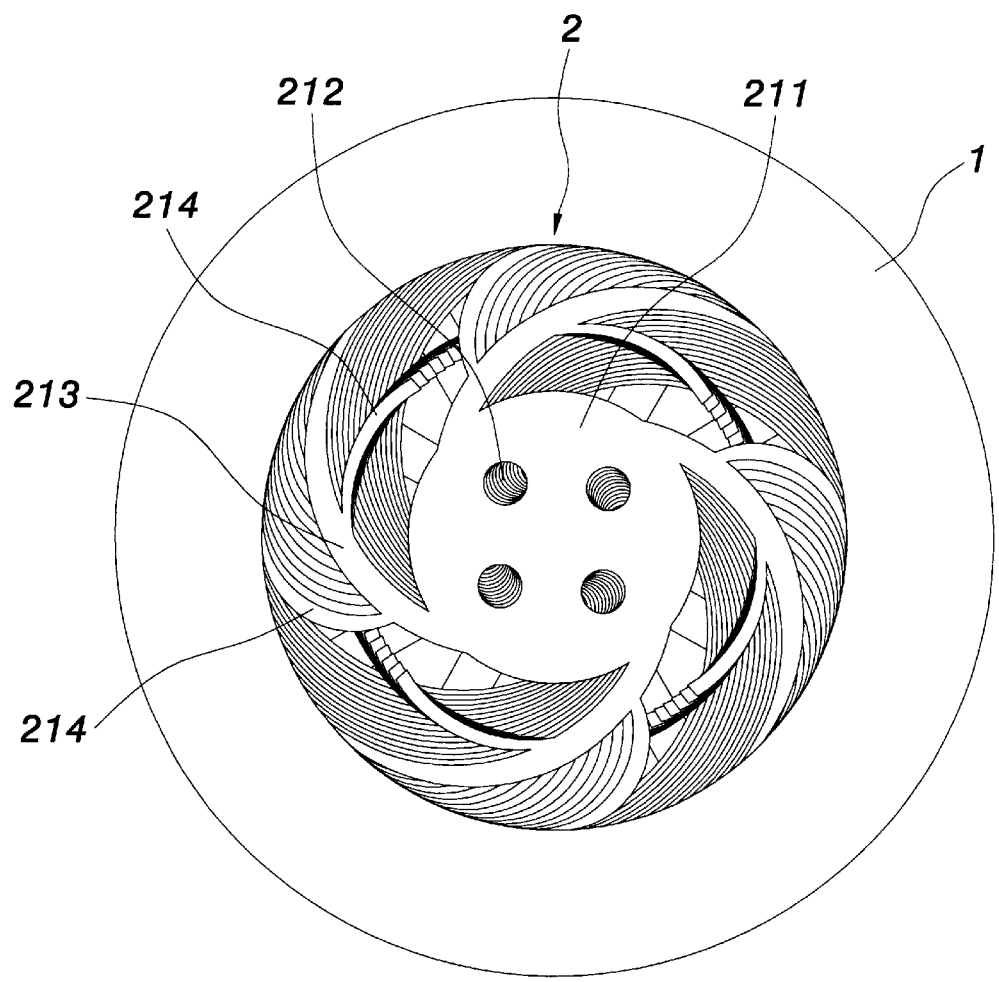
FIG. 3 is a top view particularly illustrating a heat sink according to an embodiment of the invention.

Via a protractor head, each heat dissipating plate 21 is axially stacked over a lower heat dissipating plate by being angularly rotated from an alignment position between the two adjacent heat dissipating plate. The heat dissipating plates 21 are thereby stacked in a stepped manner, which achieves the heat sink 2, in a top view, to be a spiral and stepped shape, as shown in FIG. 3. The heat dissipating plates 21 are fixedly fastened with one another via any adequate fastening elements such as solder pastes, rivets, nails, etc.

Between the heat dissipating fan 1 and the CPU 3 is further arranged a guiding plate 4. In this embodiment, the guiding plate 4 is, for example, approximately cylindrical. The guiding plate 4 is provided with a plurality of guiding grooves 41 that radially extend outward.

Figure 4:
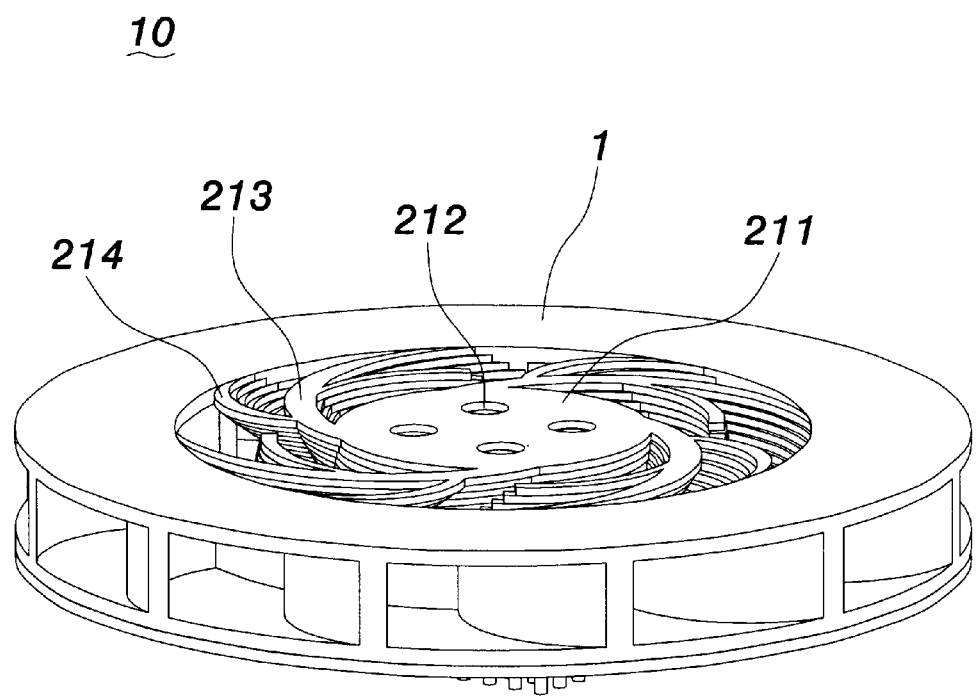
FIG. 4 is a perspective view illustrating an assembled heat dissipating module according to an embodiment of the invention.

Referring to FIG. 4, when the heat sink 2 is to be assembled, a protractor head is used to stack the heat dissipating plates 21 over one another by being gradually rotated angularly relative to one another so as to form a spiral and stepped heat sink 2. The heat dissipating plates 21 are fastened with one another via, for example, solder pastes, rivets, or nails. Once achieved, the heat sink 2 is mounted to the central hollow portion of the heat dissipating fan 1. Lastly, the heat dissipating fan 1 is connected to the guiding plate 4 and, together are assembled on the CPU 3 to achieve a heat dissipating module 10 ready to operate.

Figure 5:
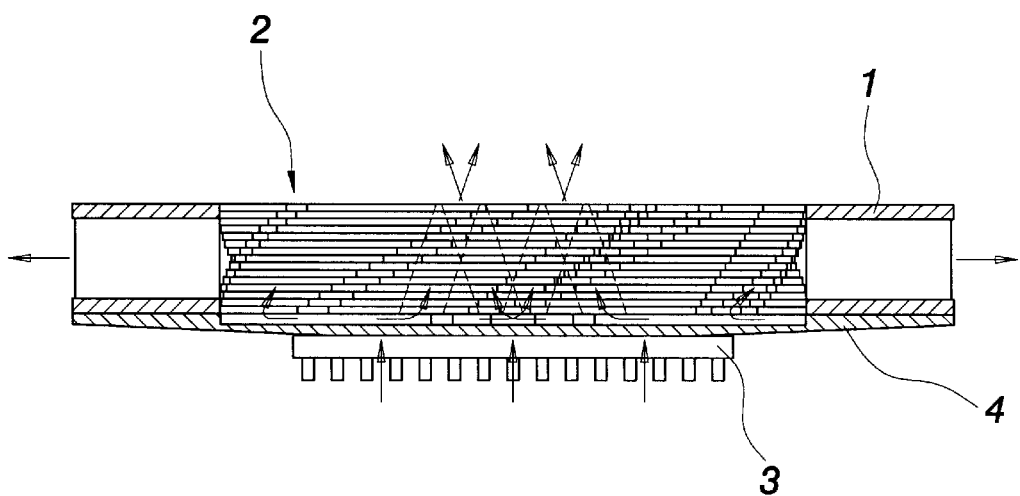
FIG. 5 is a schematic view illustrating the operation of the heat dissipating module according to an embodiment of the invention.

Referring to FIG. 2 and FIG. 5, the described embodiment refers to a heat dissipating module 10 to dissipate heat. Alternatively, the heat sink 2 may be singly mounted on the CPU 3 to dissipate heat. When the heat dissipating module 10 is used, the heat irradiated from the CPU 3 is dissipated via the heat sink 2. By rotation of the heat dissipating fan 1 and via the guiding grooves 41 and the convection holes 212, the heat dissipation by thermal convection from the heat sink 2 through the produced airflow is improved. Furthermore, the guiding grooves 41 guide the heat through the heat sink 2 to be dissipated outward via its peripheral spiral branches.

Figure 6:
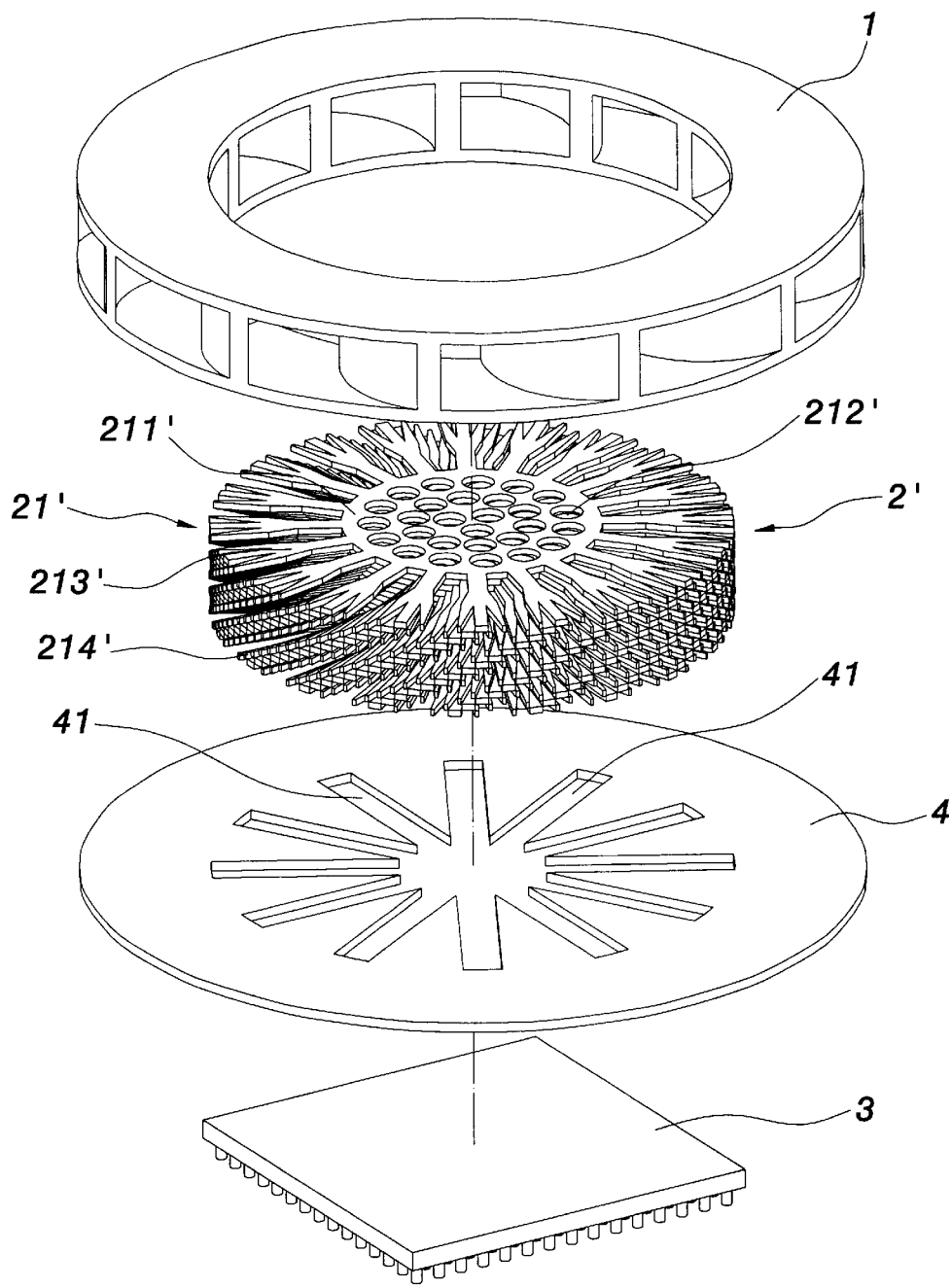
FIG. 6 is an exploded view of a heat dissipating module according to another embodiment of the invention.

Referring to FIG. 6, an exploded view illustrates another embodiment of the invention in which the heat sink 2' may be of other adequate shape. In this variant embodiment, the heat sink 2' is also formed via the stack of a plurality of heat dissipating plates 21' over one another. Each heat dissipating plate 21' comprises a base 211' that is provided with a plurality of convection holes 212' substantially occupying the entire base 211'. The base 211', at an outer periphery, further extends into a plurality of approximately radial branches 213'. Each branch 213' further extends into a plurality of sub-branches 214' in a tree-branch extension manner to increase the surface area of the heat sink 2'. The heat dissipating plates 21' are axially stacked over one another being angularly rotated from one another to achieve a stepped shape.

Figure 7:
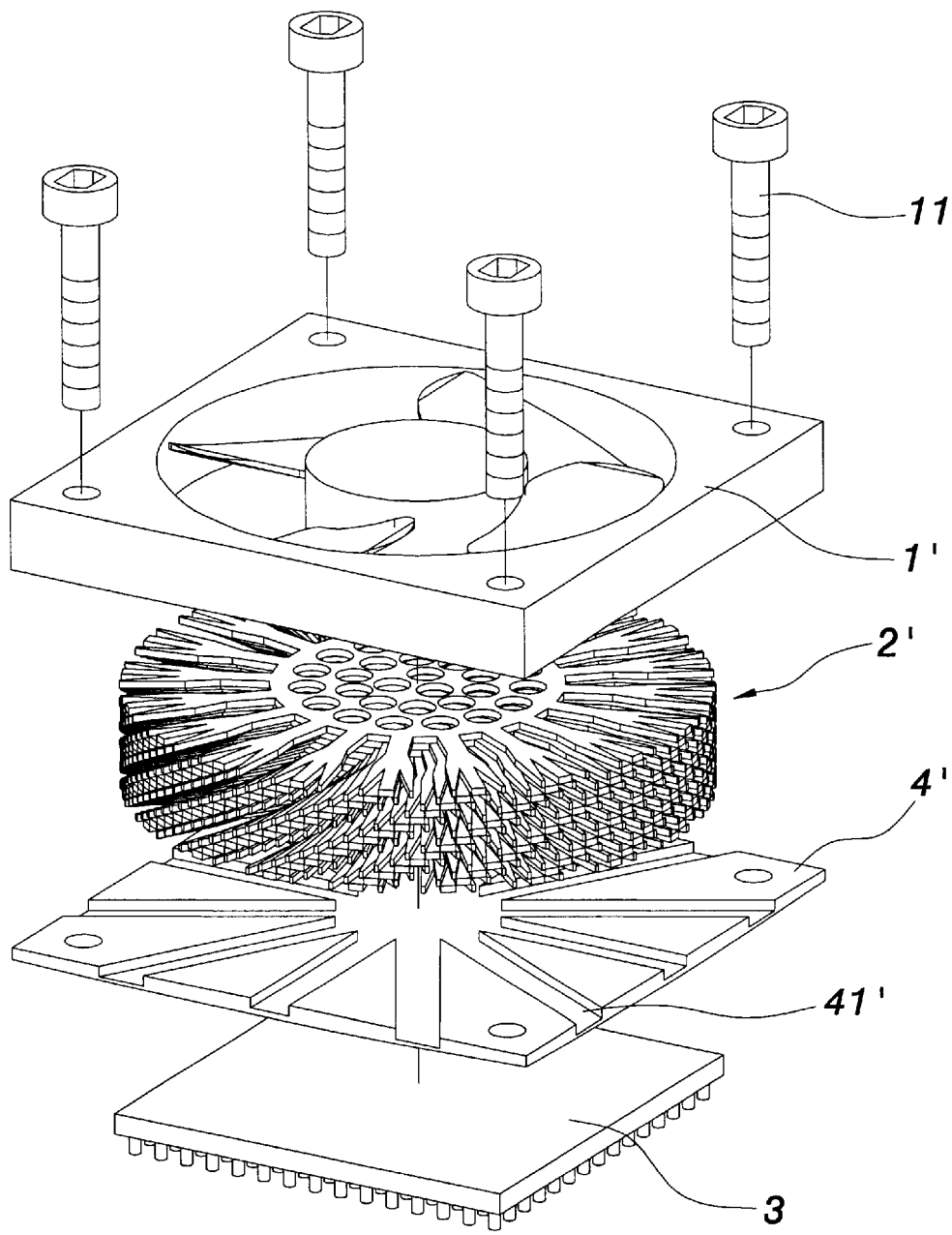
FIG. 7 is an exploded view of a heat dissipating module according to another variant embodiment of the invention.

Referring to FIG. 7, an exploded view schematically illustrates another variant embodiment of the invention in which the heat dissipating fan 1' is fixedly fastened with the guiding plate 4' by means of a screw assembly 11. The heat sink 2' is therefore placed between heat dissipating fan 1' and the guiding plate 4' that is shaped approximately rectangular. The guiding plate 4' is provided with a plurality of guiding grooves 41' that radially extend outward.

As described above, because the heat sink 2 of the invention is formed via stamping, its fabrication cost is therefore more economical than that of the conventional heat sink formed by aluminum extrusion. Furthermore, according to one embodiment of the invention, the heat sink 2 is formed with a spiral and stepped shape, which favorably increases its heat dissipating surface area to achieve an optimal heat dissipation.

Those skilled in the art will readily appreciate that the above description is only illustrative of specific embodiments and examples of the invention. The invention should therefore cover various modifications and variations made to the herein-described structure and operations of the invention, provided they fall within the scope of the invention as defined in the following appended claims.

What is claimed is:

1. A spiral step-shaped heat dissipating module, suitable for being mounted to a heat-emitting element to dissipate heat, the heat dissipating module comprising:

a heat dissipating fan;

a heat sink, mounted to the heat dissipating fan, the heat sink including a plurality of heat dissipating plates formed by stamping and stacked over one another while being angularly rotated relative to one another to form a spiral and stepped shape, each of the heat dissipating plates providing a plurality of convection holes; and a guiding plate, mounted between the heat sink and the heat-emitting element and providing a plurality of guiding grooves extended radially and outwardly from a center thereof;

wherein an airflow produced by a rotation of the heat dissipating fan generates a thermal convection to the outside via the guiding grooves and the convection holes, the guiding grooves further guiding the heat through the heat sink to be externally dissipated via the spiral periphery of the heat sink.

2. The module of claim 1, wherein the heat dissipating fan is provided with a hollow central portion mounted to the heat sink.

3. The module of claim 1, wherein each of the heat dissipating plates comprises a base having four convection holes formed thereon, a plurality of spiral branches extended from an outer periphery thereof, and a plurality of sub-branches provided with each of the spiral branches so as to have a tree-branch shape.

4. The module of claim 1, wherein the heat dissipating plates are fixedly fastened with one another via solder pastes, rivets or nails.

5. The module of claim 1, wherein each of the heat dissipating plates comprises a base filled entirely with the convection holes, a plurality of radial branches extended from an outer periphery thereof, and a plurality of sub-branches provided with each of the radial branches so as to have a tree-branch shape.

6. The module of claim 1, wherein the heat dissipating fan is further fixedly fastened with the guiding plate by means of a screw assembly, the heat sink being placed between the heat dissipating fan and the guiding plate, and said guiding plate being rectangular and providing a plurality of radial guiding grooves.

7. The module of claim 1, wherein the heat-emitting element is a central processing unit (CPU).

8. The module of claim 1, wherein the heat dissipating fan is an axial airflow fan.

9. A heat sink, comprising a plurality of heat dissipating plates formed by stamping and stacked over one another while being angularly rotated relative to one another to form a spiral and stepped shape, each of the heat dissipating plates providing a plurality of convection holes.

10. The heat sink of claim 9, wherein each of the heat dissipating plates comprises a base having four convection holes formed thereon, a plurality of spiral branches extended from an outer periphery thereof, and a plurality of sub-branches provided with each of the radial branches so as to have a tree-branch shape.

11. The module of claim 9, wherein the heat dissipating plates are fixedly fastened with one another via solder pastes, rivets or nails.

12. The module of claim 9, wherein the each of heat dissipating plates comprises a base filled entirely with the convection holes, a plurality of radial branches extended from an outer periphery thereof, and a plurality of sub-branches provided with each of the radial branches so as have a tree-branch shape.

* * * * *